(12) United States Patent
Chen et al.

(10) Patent No.: US 6,265,298 B1
(45) Date of Patent: Jul. 24, 2001

(54) METHOD FOR FORMING INTER-METAL DIELECTRICS

(75) Inventors: Shuenn-Jeng Chen, Tainan Hsien; Ching-Hsing Hsieh, Pingtung Hsien; Chih-Ching Hsu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/249,882

(22) Filed: Feb. 16, 1999

(30) Foreign Application Priority Data

Dec. 4, 1998 (TW) .................................................. 87120148

(51) Int. Cl.⁷ .................................................. H01L 21/44
(52) U.S. Cl. ...................... 438/597; 438/597; 438/598; 438/618; 438/622; 438/624; 438/625; 438/626; 438/787; 438/788; 438/792
(58) Field of Search ...................... 438/597, 631, 438/624–26, 618, 622, 598, 584, 787–788, 792

(56) References Cited

U.S. PATENT DOCUMENTS

| | | | |
|---|---|---|---|
| 5,270,267 | * 12/1993 | Ouellet | 437/231 |
| 5,366,850 | * 11/1994 | Chen et al. | 430/314 |
| 5,610,105 | * 3/1997 | Vines et al. | 437/235 |
| 5,627,094 | * 5/1997 | Chan et al. | 438/253 |
| 5,726,086 | * 3/1998 | Wu | 438/253 |
| 5,759,906 | * 6/1998 | Lou | 438/623 |
| 5,789,313 | * 8/1998 | Lee | 438/599 |
| 5,849,640 | * 12/1998 | Hsia et al. | 438/734 |
| 5,858,869 | * 1/1999 | Chen et al. | 438/597 |
| 5,989,983 | * 11/1999 | Goo et al. | 438/473 |
| 6,060,384 | * 5/2000 | Chen et al. | 438/623 |
| 6,169,039 | * 11/1998 | Lin et al. | 438/761 |

* cited by examiner

Primary Examiner—Matthew Smith
Assistant Examiner—Granvill D. Lee
(74) Attorney, Agent, or Firm—Jiawei Huang; J.C. Patents

(57) ABSTRACT

An improved method for forming inter-metal dielectrics (IMD) over a semiconductor substrate is provided, wherein a conductive line is formed thereon. A first dielectric layer is formed over the conductive line. A second dielectric layer is formed on the first dielectric layer by a spin-on glass method. A curing treatment with an electron beam having a low energy and a high dosage is performed to cure an upper portion of the second dielectric layer so that a cured third dielectric layer is formed on the second dielectric layer. A fourth dielectric layer is formed on the cured third dielectric layer. A chemical-mechanical polishing process is performed using the cured dielectric layer as a stop layer. A cap layer is formed on the fourth dielectric layer.

5 Claims, 2 Drawing Sheets

METHOD FOR FORMING INTER-METAL DIELECTRICS

CROSS-REFERENCE TO RELATED APPLICATION

This application claims the priority benefit of Taiwan application Ser. No. 87120148, filed Dec. 4, 1998, the full disclosure of which is incorporated herein by reference.

BACKGROUND OF THE INVENTION

1. Field of the Invention

The present invention relates to a semiconductor process. More particularly, the present invention relates to a method for forming inter-metal dielectrics (IMD) on a semiconductor substrate.

2. Description of Related Art

With the increased integration in integrated circuits (IC), a conventional wafer can no longer provide sufficient area for interconnects. In order to satisfy performance requirements, design rules of forming more than two metal layers for interconnects are gradually applied in integrated circuits. An inter-metal dielectric (IMD) layer is formed between two metal layers for isolation. Since a metal layer and a dielectric layer are alternately laminated to form metal interconnects, the planarization of the dielectric layer is more important. If the result of the planarization is not ideal, the uneven surface of the dielectric layer causes misalignment while a subsequent photolithography process is performed so that the pattern cannot accurately transfer onto the metal line and the process becomes more difficult.

In general, a spin-on glass (SOG) method is used in metal interconnects fabrication. The method includes coating SOG material on a wafer. Then a curing treatment is performed, in which the unwanted solvent of the SOG material is removed at a high temperature by a thermal treatment to cure the SOG material. Thus, a SOG layer is formed. The SOG material has better step coverage ability and better gap filling ability, therefore, the voids between the metal layers can be easily filled. In SOG application, a sandwich-type structure is provided, in which a dielectric layer made of SOG material is formed between two silicon oxide layers formed by chemical vapor deposition (CVD). Thus, the properties of the SOG layer such as dielectric constant cannot be affected in a subsequent process.

FIGS. 1A through 1B are schematic, cross-sectional views showing a conventional method of forming an inter-metal dielectric layer.

As shown in FIG. 1A, a semiconductor substrate 11 is provided. A metal line 10 is formed over the substrate 11. A silicon oxide layer 12, a SOG layer 14, and a silicon oxide layer 16 are subsequently formed on the metal line 10 to form a sandwich type structure.

Turning to FIG. 1B, a chemical-mechanical polishing (CMP) process is performed to planarize the silicon oxide layer 16. A cap oxide layer 18 is formed on the silicon oxide layer 16 to cover some scratches generated while performing the CMP process. Thus, an inter-metal dielectric layer 19 with a flat surface is formed.

However, while performing the CMP process, no layers, including the SOG layer 14 and the silicon oxide layer 16, are hard enough to serve as a stop layer, therefore the metal line 10 is usually polished and damaged.

One conventional method for solving the above-mentioned problem is to implant ions into the SOG layer after the SOG layer is cured. This implantation makes the cured SOG layer harder, so it can be used as a stop layer. However, in this method, two steps including a curing treatment and an ion implantation are needed so that the process is more complicated, the device throughout is thus decreased and the cost is increased.

Another conventional method is to cure the SOG layer with a high-energy, high-dosage electron beam, so that the metal line is not damaged while performing the CMP process and the metal line is not affected while subsequently forming a via hole. However, although no additional step is added in this method, the dielectric constant of the SOG layer between the two metal layers is increased so as to decrease the isolation effect of the metal line and then, to affect the RC delay time. Moreover, SOG shrinkage adversely affect the planarization of the SOG layer.

Therefore, it is desirable to provide a method which can resolve the above-mentioned problems.

SUMMARY OF THE INVENTION

Accordingly, the present invention provides a method for forming inter-metal dielectrics (IMD) on a semiconductor substrate, which does not adversely affect the dielectric constant of an inter-metal dielectric layer and does not damage to a conductive line during a chemical-mechanical polishing (CMP) process.

To achieve these and other advantages and in accordance with the purpose of the invention, as embodied and broadly described herein, the invention provides a method for forming inter-metal dielectrics (IMD) over a semiconductor substrate, wherein a conductive line is formed thereon. A first dielectric layer is formed over the conductive line. A second dielectric layer is formed on the first dielectric layer by a spin-on glass method. A curing treatment with an electron beam having a low energy and a high dosage is performed to cure an upper portion of the second dielectric layer so that a cured third dielectric layer is formed on the second dielectric layer. A fourth dielectric layer is formed on the cured third dielectric layer. A chemical-mechanical polishing process is performed using the cured dielectric layer as a stop layer. A cap layer is formed on the fourth dielectric layer.

The present invention uses an electron beam with a low energy and a high dosage, so that only a portion of the SOG layer is cured. Therefore, the dielectric constant of the SOG layer in the present invention is lower than that in the conventional method. Furthermore, the shrinkage of the SOG layer formed in accordance with the present invention is reduced and the crack thereof.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
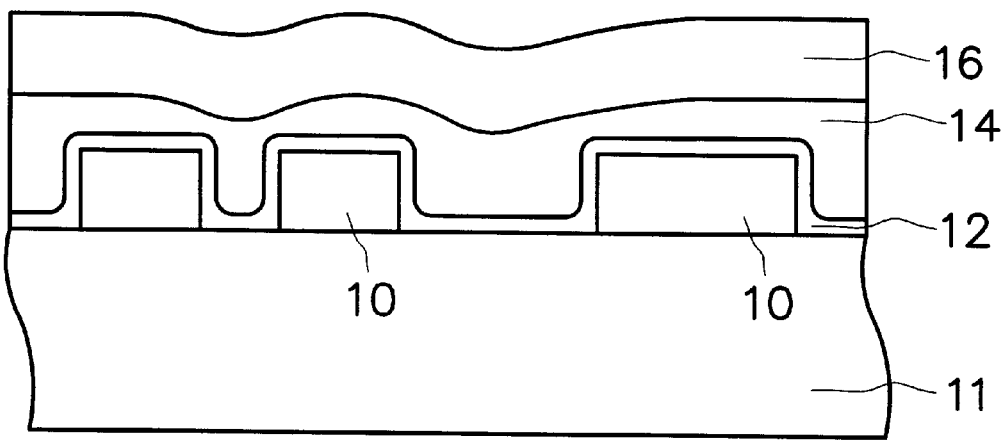
FIGS. 1A through 1B are schematic, cross-sectional views showing a conventional method of forming an inter-metal dielectric layer.
Figure 1B:
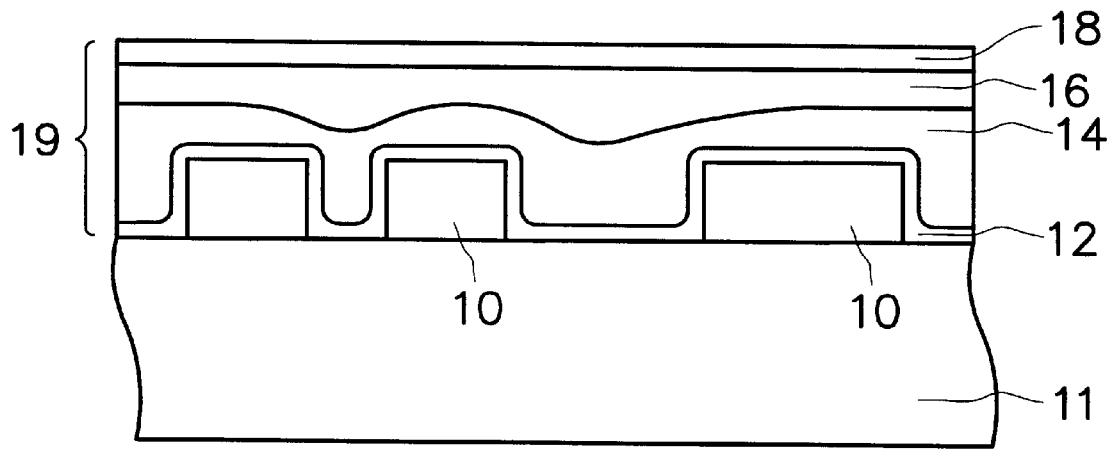

Reference will now be made in detail to the present preferred embodiments of the invention, examples of which are illustrated in the accompanying drawings. Wherever possible, the same reference numbers are used in the drawings and the description to refer to the same or like parts.

Figure 2A:
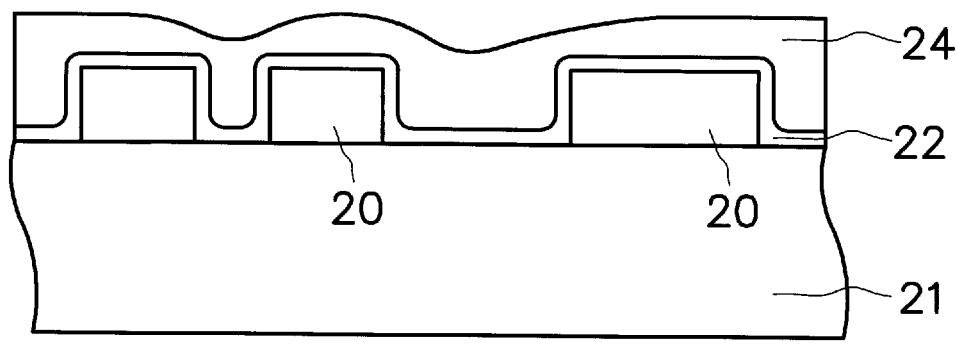
FIGS. 2A through 2B are schematic, cross-sectional views showing a method of forming an inter-metal dielectric layer according to one preferred embodiment of this invention.
Figure 2B:
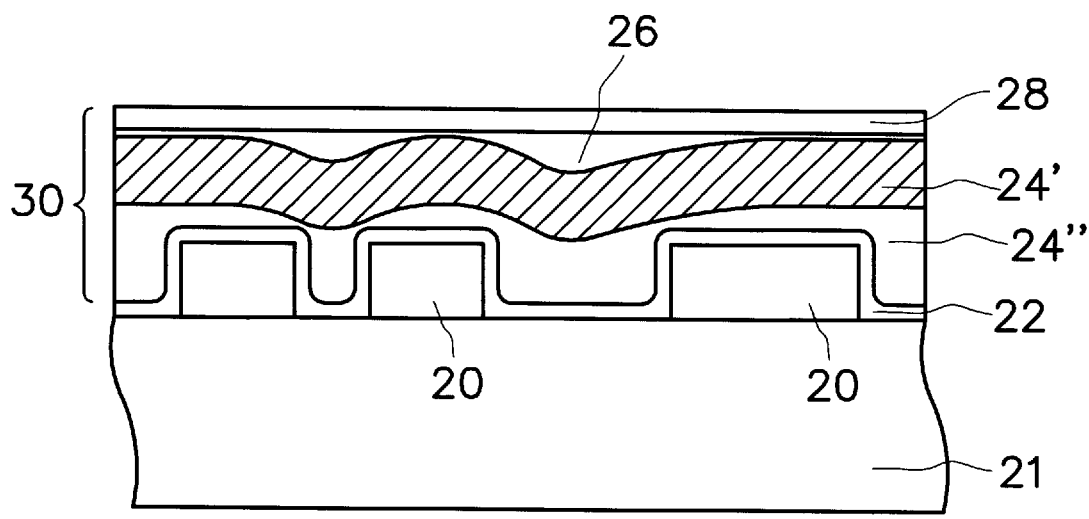

FIGS. 2A through 2B are schematic, cross-sectional views showing a method of forming an inter-metal dielectric layer according to one preferred embodiment of the invention.

As shown in FIG. 2A, a semiconductor substrate 21 is provided. A conductive line 20 is formed over the substrate 21 to serve as subsequently formed metal interconnects. A dielectric layer 22 is formed over the conductive line 20, for example, by plasma-enhanced chemical vapor deposition (PECVD). The dielectric layer 22 includes, for example, silicon oxide. Preferably, the PECVD process is performed at lower temperature so as to decrease effects for the conductive line 20.

A spin-on glass (SOG) layer 24 is formed over the dielectric layer 22. The SOG layer 24 formation includes dissolution of a dielectric material in a solvent to serve as source of spin-on glass (SOG). The SOG material is spin coated on the dielectric layer 22. The SOG layer 24 is preferably about 4500 Å thick. In one preferred embodiment for performing the present method, the SOG layer 24 is preferably made of inorganic SOG material so that an etching back process is not necessarily performed after the SOG layer 24 is formed. Moreover, after the SOG layer is cured, ions are not necessarily implanted into the SOG layer to serve as a stop layer. Thus the present process is simplified.

As shown in FIG. 2B, a curing treatment is performed. The substrate 21 is exposed with a low-energy, high-dosage electron beam. In one preferred embodiment for performing the present method, the energy level of the electron beam is from about 2 KeV to about 4 KeV and the dosage level thereof is from about 8000 c/cm$^2$ to about 10000 c/cm$^2$. During electron beam exposure, an upper portion of the SOG layer 24 (FIG. 2A) is cured and converted into a cured SOG layer 24' which is like a thermal oxide on the surface of the SOG layer 24. At the same time, a lower portion 24" of the SOG layer 24 is not cured by the electron beam. In case that floatable oxide is used as the SOG material, the cured dielectric layer 24' will include hydrogen bonds, but has the same property as thermal oxide. In performance of the present method, an electron beam with low energy is used so that only the upper portion of the SOG layer 24 (FIG. 2A) is cured. The thickness of the cured SOG layer 24' is about two times that of the uncured SOG layer 24"; in other words, the thickness of the cured dielectric layer 24' is about two thirds the thickness of the SOG layer 24 (FIG. 2A). Since only a portion of the SOG layer 24 (FIG. 2A) is cured, the SOG can maintain a low dielectric constant and the SOG layer between two metal layers can continue to function as a dielectrics. Moreover, after exposure to the high-dosage electron beam, the surface of the cured SOG layer becomes more compact and is harder, so that the cured SOG layer 24' can be used as a stop layer during a subsequent chemical-mechanical polishing process. Furthermore, due to the compact surface, the SOG layer of the invention not only stops the uncured portion from moving about, but is also water resistance.

A dielectric layer 26 is formed on the cured dielectric layer 24'. A chemical-mechanical polishing (CMP) process is performed to planarize the dielectric layer 26. While the dielectric layer 26 is polished, the cured SOG layer 24' can be used as a stop layer to avoid damage to the conductive line 20 and to enhance planarization ability. Moreover, the SOG layer can protect the conductive line from damage.

The CMP process can obtain the dielectric layer 26 with a flat surface, but some scratches are generated on the dielectric layer 26. Therefore, after the dielectric layer 26 is planarized, a cap layer 28, such as silicon oxide, is formed on the dielectric layer 26 to obtain an inter-metal dielectric layer 30 with a flat surface and without the scratches, in which the inter-metal dielectric layer 30 comprises the cap layer 28, the dielectric layer 26, the cured SOG layer 24', the uncured SOG layer 24", and the dielectric layer 22.

It will be apparent to those skilled in the art that various modifications and variations can be made to the structure of the present invention without departing from the scope or spirit of the invention. In view of the foregoing it is intended that the present invention cover modifications and variations of this invention provided they fall within the scope of the following claims and their equivalents.

What is claimed is:

1. A method for forming inter-metal dielectrics (IMD) over a semiconductor substrate wherein a conductive line is formed thereon, comprising:

forming a first dielectric layer over the conductive line;

forming a second dielectric layer on the first dielectric layer by a spin-on glass method;

performing a curing treatment with an electron beam having a low energy and a high dosage to cure an upper portion of the second dielectric layer so that a cured third dielectric layer is formed on the second dielectric layer;

forming a fourth dielectric layer on the cured third dielectric layer;

performing a chemical-mechanical polishing process using the cured dielectric layer as a stop layer; and forming a cap layer on the fourth dielectric layer.

2. The method according to claim 1, wherein the first dielectric layer, the second dielectric layer, the third dielectric layer, and the cap layer comprise silicon oxide.

3. The method according to claim 1, wherein the second dielectric layer comprises flowable oxide.

4. The method according to claim 1, wherein the low energy of the electron beam is from about 2 KeV to about 4 KeV.

5. The method according to claim 1, wherein the high dosage of the electron beam is from about 8000 c/cm$^2$ to about 1000 c/cm$^2$.

* * * * *